United States Patent
Wang

(10) Patent No.: US 12,426,426 B2
(45) Date of Patent: Sep. 23, 2025

(54) ARRAYS OF LED STRUCTURES EXTENDING THROUGH HOLES IN A DIELECTRIC LAYER AND INDEPENDENTLY ACTIVATED

(71) Applicant: Snap Inc., Santa Monica, CA (US)

(72) Inventor: Tao Wang, Sheffield (GB)

(73) Assignee: Snap Inc., Santa Monica, CA (US)

( * ) Notice: Subject to any disclaimer, the term of this patent is extended or adjusted under 35 U.S.C. 154(b) by 367 days.

(21) Appl. No.: 17/597,698

(22) PCT Filed: Jul. 14, 2020

(86) PCT No.: PCT/EP2020/069911
§ 371 (c)(1),
(2) Date: Jan. 19, 2022

(87) PCT Pub. No.: WO2021/013641
PCT Pub. Date: Jan. 28, 2021

(65) Prior Publication Data
US 2022/0262848 A1    Aug. 18, 2022

(30) Foreign Application Priority Data
Jul. 19, 2019   (GB) ..................................... 1910348

(51) Int. Cl.
*H10H 29/14*     (2025.01)
(52) U.S. Cl.
CPC .................................. *H10H 29/142* (2025.01)
(58) Field of Classification Search
CPC .... H01L 27/156; H01L 33/0075; H01L 33/08
See application file for complete search history.

(56) References Cited

U.S. PATENT DOCUMENTS

| | | | |
|---|---|---|---|
| 6,342,404 B1 | 1/2002 | Shibata et al. | |
| 10,707,374 B2 * | 7/2020 | Danesh | H01L 25/0753 |
| 11,374,147 B2 | 6/2022 | Charles | |
| 11,569,446 B2 * | 1/2023 | Myoung | H10K 85/141 |

(Continued)

FOREIGN PATENT DOCUMENTS

| | | |
|---|---|---|
| CN | 1316782 | 10/2001 |
| CN | 1419301 A | 5/2003 |

(Continued)

OTHER PUBLICATIONS

"U.S. Appl. No. 17/250,997, Examiner Interview Summary mailed Jan. 12, 2024", 2 pgs.

(Continued)

*Primary Examiner* — Wael M Fahmy
*Assistant Examiner* — Tiberiu Dan Onuta
(74) *Attorney, Agent, or Firm* — Schwegman Lundberg & Woessner, P.A.

(57) ABSTRACT

A method of producing a light emitting diode (LED) array comprises: forming a semiconductor layer of group III nitride material; forming a dielectric mask layer over the semiconductor layer, the dielectric mask layer having an array of holes through it each exposing an area of the semiconductor layer; and growing an LED structure in each of the holes. The array of holes comprises a first set of holes each having a first cross sectional area and a second set of holes each having a second cross sectional area different from the first cross sectional area.

20 Claims, 3 Drawing Sheets

(56) References Cited

U.S. PATENT DOCUMENTS

| | | |
|---|---|---|
| 2003/0087462 A1 | 5/2003 | Koide et al. |
| 2003/0107047 A1 | 6/2003 | Okuyama et al. |
| 2006/0244002 A1 | 11/2006 | Hooper et al. |
| 2007/0257264 A1 | 11/2007 | Hersee et al. |
| 2010/0140629 A1 | 6/2010 | Lee et al. |
| 2012/0061641 A1 | 3/2012 | Seong et al. |
| 2014/0166974 A1 | 6/2014 | Yoo et al. |
| 2014/0203293 A1 | 7/2014 | Hwang et al. |
| 2014/0209859 A1 | 7/2014 | Cha et al. |
| 2014/0246647 A1 | 9/2014 | Cha et al. |
| 2014/0363912 A1 | 12/2014 | Ohlsson et al. |
| 2015/0137072 A1 | 5/2015 | Lee et al. |
| 2016/0056336 A1 | 2/2016 | Hwang et al. |
| 2016/0064607 A1 | 3/2016 | Yoo et al. |
| 2016/0126702 A1 | 5/2016 | Ristic et al. |
| 2017/0005242 A1 | 1/2017 | Kim et al. |
| 2017/0237234 A1 | 8/2017 | Han et al. |
| 2018/0076363 A1 | 3/2018 | Schubert et al. |
| 2019/0123235 A1 | 4/2019 | Cho et al. |
| 2019/0355703 A1 | 11/2019 | Hikmet et al. |
| 2019/0355868 A1 | 11/2019 | Fimland et al. |
| 2021/0249467 A1* | 8/2021 | He ........................ H10H 29/14 |
| 2021/0313497 A1* | 10/2021 | Pourquier ............ H10H 20/811 |
| 2021/0335884 A1 | 10/2021 | Wang |
| 2022/0037393 A1 | 2/2022 | Robin |
| 2022/0131041 A1 | 4/2022 | Thompson et al. |
| 2022/0278165 A1* | 9/2022 | Wang ................... H10H 20/813 |
| 2023/0051845 A1 | 2/2023 | Zollner et al. |
| 2023/0307579 A1 | 9/2023 | Li et al. |
| 2023/0335576 A1 | 10/2023 | Zhang |
| 2023/0420627 A1 | 12/2023 | Armitage |
| 2024/0063333 A1 | 2/2024 | Hansen |
| 2025/0022910 A1 | 1/2025 | Wang |
| 2025/0089429 A1 | 3/2025 | Wang |
| 2025/0151458 A1 | 5/2025 | Feng et al. |
| 2025/0151494 A1 | 5/2025 | Feng et al. |
| 2025/0151495 A1 | 5/2025 | Feng et al. |

FOREIGN PATENT DOCUMENTS

| | | |
|---|---|---|
| CN | 102187477 | 9/2011 |
| CN | 102709410 A | 10/2012 |
| CN | 103098216 | 5/2013 |
| CN | 105009307 A | 10/2015 |
| CN | 107833878 A | 3/2018 |
| CN | 111864024 A | 10/2020 |
| CN | 112823421 A | 5/2021 |
| CN | 114424350 A | 4/2022 |
| CN | 114521296 A | 5/2022 |
| EP | 3864699 A1 | 8/2021 |
| EP | 4000093 A1 | 5/2022 |
| EP | 4000106 A1 | 5/2022 |
| JP | 2002026387 A | 1/2002 |
| JP | 2003505857 A | 2/2003 |
| JP | 2007027298 A | 2/2007 |
| JP | 2007035936 A | 2/2007 |
| JP | 2009071220 A | 4/2009 |
| JP | 2010512017 A | 4/2010 |
| JP | 2010135859 A | 6/2010 |
| JP | 2011258631 A | 12/2011 |
| JP | 2016527706 A | 9/2016 |
| JP | 2018502436 A | 1/2018 |
| JP | 2019012744 A | 1/2019 |
| JP | 2020513167 A | 4/2020 |
| JP | 2022504524 A | 1/2022 |
| JP | 7407181 B2 | 12/2023 |
| JP | 7438323 B2 | 2/2024 |
| JP | 7504983 B2 | 6/2024 |
| JP | 7617236 | 1/2025 |
| KR | 20040092673 A | 11/2004 |
| KR | 20140096970 | 8/2014 |
| KR | 101721846 B1 | 4/2017 |
| KR | 20170074296 | 6/2017 |
| KR | 20210069101 A | 6/2021 |
| KR | 102572630 B1 | 8/2023 |
| KR | 102790443 | 3/2025 |
| WO | 0207232 A1 | 1/2002 |
| WO | WO-2011162715 A1 | 12/2011 |
| WO | 2012059837 A1 | 5/2012 |
| WO | 2016049507 A1 | 3/2016 |
| WO | WO-2016054232 A1 | 4/2016 |
| WO | WO-2018057041 A1 | 3/2018 |
| WO | 2019002786 | 1/2019 |
| WO | WO-2019063957 A1 | 4/2019 |
| WO | WO-2020074875 A1 | 4/2020 |
| WO | 2021013641 | 1/2021 |
| WO | WO-2021013642 A1 | 1/2021 |
| WO | WO-2021133530 A1 | 7/2021 |
| WO | WO-2022263756 A1 | 12/2022 |

OTHER PUBLICATIONS

"U.S. Appl. No. 17/250,997, Non Final Office Action mailed Feb. 23, 2024", 15 pgs.

"U.S. Appl. No. 17/250,997, Preliminary Amendment filed Aug. 6, 2021", 6 pgs.

"U.S. Appl. No. 17/250,997, Response filed Jan. 10, 2024 to Restriction Requirement mailed Nov. 14, 2023", 6 pgs.

"U.S. Appl. No. 17/250,997, Restriction Requirement mailed Nov. 14, 2023", 7 pgs.

"U.S. Appl. No. 17/597,699, Preliminary Amendment filed Jul. 5, 2022", 5 pgs.

"European Application Serial No. 19787394.6, Indication of deficiencies in a request under Rule 22 EPC mailed Apr. 3, 2023", 2 pgs.

"European Application Serial No. 19787394.6, Response to Communication pursuant to Rules 161(1) and 162 EPC filed Nov. 29, 2021", 14 pgs.

"European Application Serial No. 20753677.2, Indication of deficiencies in a request under Rule 22 EPC mailed Apr. 3, 2023", 2 pgs.

"European Application Serial No. 20753678.0, Indication of deficiencies in a request under Rule 22 EPC mailed Apr. 3, 2023", 2 pgs.

"European Application Serial No. 20753678.0, Response to Communication pursuant to Rules 161 and 162 filed Sep. 8, 2022", 12 pgs.

"Indian Application Serial No. 202217005916, First Examination Report mailed Jul. 19, 2023", 7 pgs.

"Indian Application Serial No. 202217005917, First Examination Report mailed Nov. 1, 2023", 5 pgs.

"International Application Serial No. PCT/EP2020/069917, International Preliminary Report on Patentability mailed Feb. 3, 2022", 7 pgs.

"International Application Serial No. PCT/EP2020/069917, International Search Report mailed Nov. 12, 2020", 3 pgs.

"International Application Serial No. PCT/EP2020/069917, Written Opinion mailed Nov. 12, 2020", 5 pgs.

"International Application Serial No. PCT/GB2019/052843, International Preliminary Report on Patentability mailed Apr. 22, 2021", 7 pgs.

"International Application Serial No. PCT/GB2019/052843, International Search Report mailed Jan. 7, 2020", 3 pgs.

"International Application Serial No. PCT/GB2019/052843, Written Opinion mailed Jan. 7, 2020", 5 pgs.

"Japanese Application Serial No. 2021-519576, Notification of Reasons for Refusal mailed May 23, 2023", w/ English Translation, 7 pgs.

"Japanese Application Serial No. 2022-503481, Final Notification of Reasons for Refusal mailed Jan. 22, 2024", w/ English Translation, 4 pgs.

"Japanese Application Serial No. 2022-503481, Notification of Reasons for Refusal mailed Oct. 2, 2023", w/ English Translation, 6 pgs.

"Japanese Application Serial No. 2022-503481, Response Filed Dec. 27, 2023 to Notification of Reasons for Refusal mailed Oct. 2, 2023", w/ English Claims, 16 pgs.

"Japanese Application Serial No. 2022-503482, Notification of Reasons for Refusal mailed Oct. 3, 2023", w/ English Translation, 7 pgs.

(56) References Cited

OTHER PUBLICATIONS

"Japanese Application Serial No. 2022-503482, Response Filed Dec. 26, 2023 to Notification of Reasons for Refusal mailed Oct. 3, 2023", w/ English Claims, 14 pgs.

"United Kingdom Application Serial No. 1816455.8, Combined Search and Examination Report mailed Mar. 6, 2019", 6 pgs.

Li, M Cheng, et al., "An Analytical Compact Direct-Current and Capacitance Model for AlGaN/GaN High Electron Mobility Transistors", MRS Online Proceedings Library 1068, 10680317, [Online]. Retrieved from the Internet: <https://doi.org/10.1557/PROC-1068-C03-17>, (2007), 6 pgs.

Shiu, Guo-Yi, et al., "InGaN Light-Emitting Diodes with an Embedded Nanoporous GaN Distributed Bragg Reflectors", Scientific Reports vol. 6, 29138, [Online] Retrieved from the Internet: <URL: https://www.nature.com/articles/srep29138>, (Jul. 1, 2016), 8 pgs.

"U.S. Appl. No. 17/250,997, Final Office Action mailed Jun. 5, 2024", 19 pgs.

"U.S. Appl. No. 17/250,997, Response filed May 22, 2024 to Non Final Office Action mailed Feb. 23, 2024", 10 pgs.

"U.S. Appl. No. 17/597,699, Non Final Office Action mailed May 6, 2024", 16 pgs.

"Indian Application Serial No. 202217005917, Response filed Apr. 23, 2024 to First Examination Report mailed Nov. 1, 2023", 4 pgs.

UK Intellectual Property Office Combined Search and Examination Report dated Jan. 20, 2020.

International Search Report dated Oct. 10, 2020.

U.S. Appl. No. 17/250,997, filed Apr. 9, 2021, LED Arrays.

U.S. Appl. No. 17/597,699, filed Jan. 19, 2022, LED Arrays.

"U.S. Appl. No. 17/597,699, Corrected Notice of Allowability mailed Sep. 3, 2024", 2 pgs.

"U.S. Appl. No. 17/597,699, Examiner Interview Summary mailed Jul. 16, 2024", 2 pgs.

"U.S. Appl. No. 17/597,699, Notice of Allowance mailed Aug. 26, 2024", 12 pgs.

"U.S. Appl. No. 17/597,699, Response filed Jul. 16, 2024 to Non Final Office Action mailed May 6, 2024", 11 pgs.

"Chinese Application Serial No. 201980066550.4, Office Action mailed Apr. 10, 2024", w/ English translation, 19 pgs.

"Chinese Application Serial No. 201980066550.4, Office Action mailed Oct. 15, 2024", w/ English Translation, 14 pgs.

"Japanese Application Serial No. 2023-212818, Notification of Reasons for Rejection mailed Jul. 10, 2024", W/English Translation, 7 pgs.

"Korean Application Serial No. 10-2021-7013348, Notice of Preliminary Rejection mailed Jul. 1, 2024", w/ English translation, 13 pgs.

"Korean Application Serial No. 10-2021-7013348, Notice of Preliminary Rejection mailed Oct. 21, 2024", w/ English translation, 7 pgs.

"Korean Application Serial No. 10-2021-7013348, Response filed Aug. 8, 2024 to Notice of Preliminary Rejection mailed Jul. 1, 2024", W/English Claims, 15 pgs.

Day, Jacob, et al., "III-Nitride full-scale high-resolution microdisplays", Applied Physics Letters 99, 031116, doi:10.1063/1.3615679, (2011), 3 pgs.

Fan, Zy, et al., "III-nitride micro-emitter arrays: development and applications", J. Phys. D: Appl. Phys. 41: 094001, doi: 10.1088/0022-3727/41/9/094001, (2008), 13 pgs.

Hou, Y., et al., "Porosity-enhanced solar powered hydrogen generation in GaN photoelectrodes", Applied Physics Letters 111, 203901, https://doi.org/10.1063/1.5001938, (2017), 6 pgs.

Jiang, H.X., et al., "Nitride micro-LEDs and beyond—a decade progress review", Optics Express, vol. 21, No. S3, A4755, DOI:10.1364/OE.21.00A475, (2013), 10 pgs.

Lee, Vincent W, et al., "Micro-LED Technologies and Applications", Information Display Jun. 2016, (2016), 16-23.

Li, K.H., et al., "Confocal microscopic analysis of optical crosstalk in GaN micro-pixel light-emitting diodes", Applied Physics Letters 107, 171103, (2015), 5 pgs.

Lin, Huang-Yu, et al., "Optical cross-talk reduction in a quantum-dot-based full-color micro-light-emitting-diode display by a lithographic-fabricated photoresist mold", Photonics Research, vol. 5, No. 5, (2017), 411-416.

Sun, Cheng-Wei, et al., "71-1: Development of Micro-Pixellated GaN LED Array Micro-Display System", SID Digest of Technical Papers, (2011), 1042-1045.

Zhang, H. X., et al., "Individually-addressable flip-chip AlInGaN micropixelated light emitting diode arrays with high continuous and nanosecond output power", Optics Express, 16(13), (2008), 9918-9926.

Zhao, Jun Liu, et al., "360 PPI Flip-Chip Mounted Active Matrix Addressable Light Emitting Diode on Silicon (LEDoS) Micro-Displays", Journal of Display Technology, 9(8), (Aug. 2013), 678-682.

"Chinese Application Serial No. 201980066550.4, Response filed Aug. 9, 2024 to Office Action mailed Apr. 10, 2024", w/ English claims, 11 pgs.

"Chinese Application Serial No. 202080066179.4, Response filed Feb. 28, 2025 to Office Action mailed Nov. 15, 2024", w/ English Claims, 11 pgs.

"Chinese Application Serial No. 202080067170.5, Response filed Feb. 11, 2025 to Office Action mailed Oct. 21, 2024", w/ English Claims, 11 pgs.

"European Application Serial No. 19787394.6, Communication Pursuant to Article 94(3) EPC mailed Mar. 10, 2025", 6 pgs.

"International Application Serial No. PCT/US2024/053676, International Search Report mailed Feb. 12, 2025", 3 pgs.

"International Application Serial No. PCT/US2024/053676, Written Opinion mailed Feb. 12, 2025", 3 pgs.

"International Application Serial No. PCT/US2024/053698, International Search Report mailed Feb. 4, 2025", 4 pgs.

"International Application Serial No. PCT/US2024/053698, Written Opinion mailed Feb. 4, 2025", 4 pgs.

"International Application Serial No. PCT/US2024/053906, International Search Report mailed Feb. 11, 2025", 4 pgs.

"International Application Serial No. PCT/US2024/053906, Written Opinion mailed Feb. 11, 2025", 6 pgs.

"Japanese Application Serial No. 2022-503481, Response filed Mar. 25, 2024 to Final Notification of Reasons for Refusal mailed Jan. 22, 2024", w/ English claims, 9 pgs.

"Japanese Application Serial No. 2023-212818, Response filed Oct. 10, 2024 to Notification of Reasons for Rejection mailed Jul. 10, 2024", w/ English claims, 13 pgs.

"Japanese Application Serial No. 2024-019309, Notification of Reasons for Refusal mailed Jan. 8, 2025", w/ English translation, 9 pgs.

"Indian Application Serial No. 202217005916, Response filed Jan. 11, 2024 to First Examination Report mailed Jul. 19, 2023", w English Claims, 26 pgs.

"U.S. Appl. No. 17/597,699, 312 Amendment filed Nov. 22, 2024", 3 pgs.

"U.S. Appl. No. 17/597,699, Corrected Notice of Allowability mailed Nov. 27, 2024", 2 pgs.

"U.S. Appl. No. 17/597,699, Corrected Notice of Allowability mailed Dec. 2, 2024", 3 pgs.

"Chinese Application Serial No. 202080066179.4, Office Action mailed Nov. 15, 2024", w English translation, 14 pgs.

"Chinese Application Serial No. 202080067170.5, Office Action mailed Oct. 21, 2024", w English translation, 16 pgs.

"Korean Application Serial No. 10-2021-7013348, Response filed Nov. 18, 2024 to Notice of Preliminary Rejection mailed Oct. 21, 2024", w English Claims, 12 pgs.

"Chinese Application Serial No. 201980066550.4, Response filed Dec. 13, 2024 to Office Action mailed Oct. 15, 2024", w current English claims, 10 pgs.

"Chinese Application Serial No. 202080067170.5, Office Action mailed Mar. 3, 2025", w/ English translation, 13 pgs.

"Chinese Application Serial No. 201980066550.4, Office Action mailed Feb. 24, 2025", w/ English translation, 8 pgs.

"Japanese Application Serial No. 2024-019309, Response filed Mar. 27, 2025 to Notification of Reasons for Refusal mailed Jan. 8, 2025", w/ English claims, 17 pgs.

(56) References Cited

OTHER PUBLICATIONS

"U.S. Appl. No. 18/924,840, Restriction Requirement mailed Apr. 10, 2025", 6 pgs.
"Chinese Application Serial No. 201980066550.4, Response filed Apr. 14, 2025 to Office Action mailed Feb. 24, 2025", w/ English Claims, 12 pgs.
"Chinese Application Serial No. 202080066179.4, Office Action mailed Jun. 12, 2025", w/ English Translation, 11 pgs.
"U.S. Appl. No. 18/924,840, Notice of Allowance mailed Jun. 24, 2025", 9 pgs.
"U.S. Appl. No. 18/924,840, Response filed Jun. 6, 2025 to Restriction Requirement mailed Apr. 10, 2025", 7 pgs.
"Chinese Application Serial No. 202080067170.5, Response filed Apr. 23, 2025 to Office Action mailed Mar. 3, 2025", w/ English Claims, 9 pgs.

\* cited by examiner

ARRAYS OF LED STRUCTURES EXTENDING THROUGH HOLES IN A DIELECTRIC LAYER AND INDEPENDENTLY ACTIVATED

CLAIM OF PRIORITY

This application is a U.S. national-phase application filed under 35 U.S.C. § 371 from International Application Serial No. PCT/EP2020/069911, filed Jul. 14, 2020, which claims the benefit of priority to United Kingdom Patent Application Serial No. 1910348.0, filed Jul. 19, 2019, each of which is incorporated herein by reference in its entirety.

FIELD OF THE INVENTION

The present invention relates to light emitting diode (LED) arrays and to methods of producing LED arrays. In particular it relates to arrays of LEDs on the micrometer scale.

BACKGROUND TO THE INVENTION

Increasing demand for brighter, enhanced resolution and more power-efficient display panels for smartwatches, smartphones, televisions, and AR/VR devices is driving the development of the micro-display technology, where micro-LEDs (pLEDs) whose diameter is on a scale of <100 μm are the key components. Group III-nitride μLEDs exhibit a number of unique features for display applications compared with organic light-emitting diodes (OLEDs) and liquid crystal display (LCD), as described for example in: Z. Y. Fan, J. Y. Lin and H. X. Jiang, J. Phys. D: Appl. Phys. 41, 094001(2008); H. X. Jiang and J. Y. Lin, Optical Express 21, A476 (2013); and J. Day, J. Li, D. Y. C. Lie, C. Bradford, J. Y. Lin and H. X. Jiang, Appl. Phys. Lett. 99, 031116 (2011). Unlike LCD, III-nitride based micro-displays, where μLEDs are the major components, are self-emissive. Displays using μLEDs exhibit high resolution, high efficiency, and high contrast ratio. OLEDs are typically operated at a current density which is several orders of magnitude lower than semiconductor LEDs in order to maintain a reasonable lifetime. As a consequence, the luminance of OLEDs is pretty low, typically 3000 cd/m$^2$ for a full colour display, while III-nitride μLEDs exhibit high luminance of above 10$^5$ cd/m$^2$. Of course, III-nitride based μLEDs intrinsically exhibit long operation lifetime and chemical robustness in comparison with OLEDs. Therefore, it is expected that III-nitride μLEDs could potentially replace LCD and OLEDs for high resolution and high brightness displays in a wide range of applications in the near future.

Two major approaches dominate the fabrication of micro-displays. A so-called pick-and-place technology has been proposed for manufacturing micro-displays (Vincent W. Lee, Nancy Twu, and Ioannis Kymissis, Information Display 6/16 (2016)). The primary challenge of the pick-and-place technology is due to pixel (i.e., red, blue, green micro-LEDs from different wafers) transfer yield. It also significantly increases the base material cost or manufacturing time to build a micro-display, thus posing a great challenge in terms of reproducibility and scalability. High resolution micro-displays, which are particularly important for smartwatches, smartphones, televisions, and AR/VR devices, request μLEDs with both a smaller diameter and a smaller pitch, such as <10 μm, the pick-and-place technology tends to be difficult. In this case, a direct integration of micro-LED arrays with arrays of transistors that provide active-matrix switching has been employed (H. X. Zhang, D. Massoubre, J. McKendry, Z. Gong, B. Guilhabert, C. Griffin, E. Gu, P. E. Jessop, J. M. Girkin, and M. D. Dawson, Optics Express 16, 9918-9926 (2008); Z. J. Liu, W. C. Chong, K. M. Wong, and K. M. Lau, J. Display Tech. 9, 678-682 (2013); and C. W. Sun, C. H. Chao, H. Y. Chen, Y. H. Chiu, W. Y. Yeh, M. H. Wu, H. H. Yen, and C. C. Liang, SID Digest of Technical Papers, 1042-1045 (2011)). However, this method suffers from a number of major drawbacks as described in GB1816455.8. Furthermore, due to the fundamental challenges in producing single multiple-colour wafers, such micro-LED based displays are based on either a single colour or the utilisation of down-conversion materials. Using the latter, multiple-colour emissions can be achieved, but it suffers from energy loss due to down-conversion processes, extra costs and challenges for accurately positioning the down-conversion materials with a diameter which has to be smaller than that of micro-LEDs, and the reliability issue of the down-conversion materials. Therefore, neither image quality nor optical efficiency is satisfactory, which would be very difficult for practical application.

Therefore, there is a need for a new approach to manufacture bright and high-resolution micro-displays. It would be desirable to have an approach involving monolithic integration of different emission wavelength micro-LEDs, such as red, blue and green micro-LEDs as individual pixels in an array, with other electronic components as well. In order to achieve a full colour micro-display without involving any down-conversion materials, an epitaxial wafer should preferably have a monolithic multiple-colour LED structure with a control configuration. Clearly, it is a great challenge to achieve multiple colour emission from a single wafer. There is another great barrier for achieving multiple-colour emissions from a single wafer. Currently, III-nitride based LEDs (i.e., including InGaN/GaN quantum wells as an emitting region) are grown on c-plane substrates. The polar orientation results in strain-induced piezoelectric fields due to the large lattice-mismatch between InGaN and GaN. As a result, the LEDs suffer a reduced overlap between the electron and hole wavefunctions, leading to a reduced quantum efficiency. This becomes even worse with increasing emission wavelength, such as green LEDs, and thus this generates the so-called "green" gap, meaning that the quantum efficiency of green LEDs is much lower than that of blue LEDs. The efficiency of III-nitride based red LEDs is even lower than that of green LEDs. Furthermore, this strain also limits the incorporation of indium into GaN, further enhancing challenges in achieving longer wavelength emission. Therefore, at the moment, red LEDs are basically exclusively based on AlGaInP. This makes it almost impossible to monolithically integrate different emission wavelength micro-LED arrays (with red, blue and green micro-LEDs as individual pixels) on a single wafer.

Therefore, it is crucial to develop different approaches to the growth and then the fabrication of monolithic multiple-colour μLED arrays all based on III-nitrides in a single wafer in order to address all the above issues. In order to meet industry requirement, any new approaches will have to be built on a scalable base.

SUMMARY OF THE INVENTION

The present invention provides a method of producing a light emitting diode (LED) array, the method comprising: forming a semiconductor layer of group III nitride material; forming a dielectric mask layer over the semiconductor layer, the dielectric mask layer having an array of holes through it each exposing an area of the semiconductor layer; and growing an LED structure in each of the holes. The array may comprise a first set of holes having a first cross sectional area and a second set of holes having a second cross sectional area which is different from the first cross sectional area.

The LED structures may be grown on the exposed areas of the semiconductor layer. The growth will generally be in the upward direction, as growth from the dielectric sidewalls of the holes will not occur. The upward growth of the LED structures within the holes may therefore result in a layered LED structure with each of the layers being generally flat or planar, and of substantially constant thickness.

The semiconductor layer may be formed on a substrate, for example of group III nitride, such as GaN, or of sapphire, silicon (Si) silicon carbide (SiC), or of glass.

The step of growing an LED structure in each of the holes may comprise growing an n-type layer. The step of growing an LED structure in each of the holes may comprise growing a prelayer in each of the holes. The step of growing an LED structure in each of the holes may comprise growing at least one active layer in each of the holes. The step of growing an LED structure in each of the holes may comprise growing a p-type layer in each of the holes. The at least one active layer may be between the n-type and p-type layers. The at least one active layer may comprise at least one quantum well layer, and may comprise multiple quantum well layers. These may be formed, for example, of InGaN or another suitable group III nitride material. A prelayer can be, for example, either an InGaN layer with low indium content and a typical thickness of <100 nm or an InGaN/GaN superlattice with low indium content (the total thickness of the superlattice is typically below 300 nm). The n-type and p-type layers may also be of group III nitride material, such as GaN, InGaN or AlGaN.

Because each LED structure is grown in a respective one of the holes, each LED structure is formed of a plurality of layers all having the same cross sectional area, which is equal to the cross sectional area of the hole in which it is grown.

The at least one active layer may have an upper surface which is below the top of the dielectric layer. Where there is only one quantum well layer, the upper surface is the upper surface of that quantum well layer. Where there is a plurality of quantum well layers, the upper surface is the upper surface of the uppermost quantum well layer. The upward direction may be defined as the direction of growth of the semiconductor layer and/or of the LED structures.

The step of forming the dielectric mask layer may comprise growing a layer of dielectric material, and etching the array of holes into the layer of dielectric material. Alternatively the dielectric layer may be grown around the areas which then form the holes, for example using a mask during the growth of the dielectric layer.

The method may further comprise etching each of the exposed areas of the semiconductor layer before growing the LED structure in each of the holes.

The semiconductor layer may provide a common electrical contact to all of the LED structures.

The semiconductor layer may be doped. For example, it may comprise a single layer of n-type or p-type group III nitride material. Alternatively, the semiconductor layer may comprise first and second sub-layers with a hetero-interface between them arranged to form a two dimensional charge carrier gas at the hetero-interface. The sub-layers may form a buffer layer and a barrier layer. The two dimensional charge carrier gas may, for example, be a two dimensional electron gas (2DEG). A two dimensional hole gas (2DHG) could also be used, but typically these have lower charge carrier density and/or mobility. It is well known that a hetero-structure comprising, for example, a layer of GaN and a layer of AlGaN or InGaN, or more generally two layers of AlGaN with different Al contents or two layers of InGaN with different In contents, can form a 2DEG at the interface between the two layers, with the electron density in the 2DEG varying with a number of factors including the Al content of the AlGaN layer or the In content of the InGaN layer. Other group III nitride hetero-interfaces can be used with the same effect.

The present invention further provides an LED array comprising a semiconductor layer, a dielectric layer extending over the semiconductor layer and having an array of LED structures extending through it. The LED structures may comprise a first set of LED structures each having a first cross sectional area and a second set of LED structures each having a second cross sectional area different from the first cross sectional area.

The first cross sectional area may be at least 1% greater, or at least 2% greater, than the second cross sectional area.

Each of the LED structures may fill the hole in which it is grown so that each LED structure has a cross sectional area which is the same as that of the hole in which it is grown. Therefore the LED structures may comprise a first set of LED structures each having a first cross sectional area, and a second set of LED structures each having a second cross sectional area different from the first cross sectional area.

The first set of LED structures may each be arranged to emit light having a first peak wavelength and the second set of LED structures may each be arranged to emit light having a second peak wavelength different from the first peak wavelength.

The array of holes may further comprise a third set of holes each having a third cross sectional area different from the first and second cross sectional areas.

The array of LED structures may include a third set of LED structures grown in the third set of holes, and the third set of LED structures may each be arranged to emit light having a third peak wavelength different from the first and second peak wavelengths.

For example the three sets may include a red set, a green set and a blue set of LED structures.

The LED structures may be arranged in a plurality of groups. The method may further comprise forming a plurality of contacts, each of the contacts being connected to a respective one of the groups of LED structures. Each of the groups of LED structures may be operable, i.e. switched on and off, independently of the other groups of LED structures. This can enable a pixelated display to be produced each pixel being formed from one of the groups of LED structures, or lighting systems with variable colour output.

Each of the groups of LED structures may include at least one LED structure from each of the sets of LED structures. This may be used, for example, in monochrome displays or white lighting systems.

Each of the groups of LED structures may include only LED structures from one of the sets of LED structures. This may be used, for example, in colour display devices.

The invention further provides an LED array comprising a semiconductor layer, a dielectric layer extending over the semiconductor layer and having an array of holes through it, and an LED device formed in each of the holes. The array may comprise a first set of holes having a first cross sectional area and a second set of holes having a second cross sectional area which is different from the first cross sectional area.

The method or the LED array may further comprise, in any workable combination, any one or more features of the preferred embodiments of the invention as will now be described with reference to the accompanying drawings.

DETAILED DESCRIPTION

Referring to FIG. 1 a, a group III nitride or other suitable semiconductor layer, for example a standard n-type GaN (n-GaN) layer 100, is initially grown on a substrate 102. The substrate 102 may be a GaN substrate, or may be any foreign substrate such as sapphire, silicon (Si), silicon carbide (SiC) or even glass. The GaN layer 100 may be grown by means of any standard GaN growth method using either metal-organic vapour phase epitaxy (MOVPE) or molecular beam epitaxy (MBE), or any other suitable growth technique. The resulting "as-grown n-GaN template" may have a thickness of above 10 μm, but typically the thickness is in the range from 500 nm to 10 μm. Subsequently, a dielectric layer 104 such as silicon dioxide ($SiO_2$) or silicon nitride (SiN), or any other suitable dielectric material, is deposited on the n-GaN layer 100 by using PECVD or any other suitable deposition technique. The thickness of the dielectric layer may be in the range from 20 nm to 500 μm.

Figure 1A:
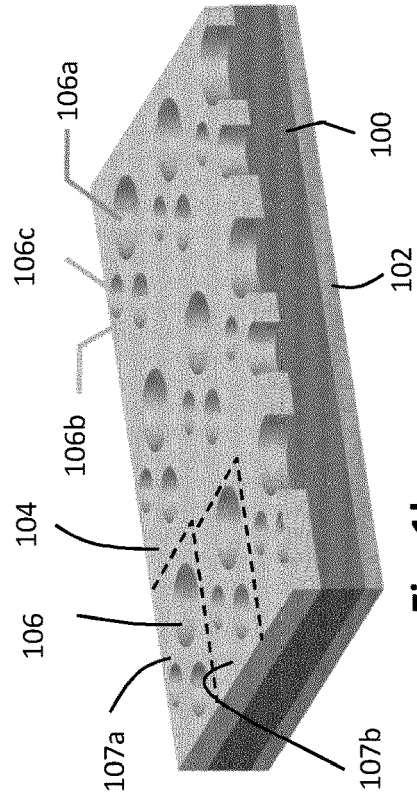
FIG. 1a shows an as-grown template formed in a process according to a first embodiment of the invention.
Figure 1B:
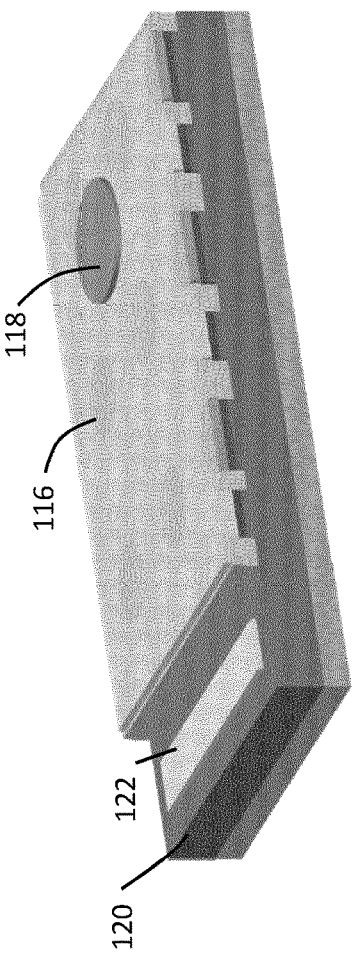
FIG. 1b shows the template of FIG. 1a with a masking pattern formed in its mask layer.

Referring to FIG. 1b, an array of holes 106 is then formed in the dielectric layer 104. The holes 106 are typically on the micrometer scale and therefore referred to as micro-holes. This may be done by means a photolithography technique and then etching processes (which can be dry-etching or wet-etching). In forming the micro-holes 106, the dielectric layer 104 is etched through its entire thickness down to the upper surface of the n-GaN layer 100. The micro-hole cross sectional areas are different. Here the cross sectional area refers to the cross section in a plane perpendicular to the general direction of etching of the holes, and parallel to the plane of the top surface of the substrate. The holes include at least two sets of holes with each set of holes having a respective different hole cross sectional area. If the holes 106 are round, they may have diameters from 1 μm to 500 μm, and the pitch distance, i.e. the distance between the centres of adjacent micro-holes, may be, for example, from 1 μm to 500 μm. Further etching, of the n-GaN layer 100, only within the micro-hole areas, may be performed using the remained dielectric layer 104 as a mask. The n-GaN etching depth can be from zero (meaning there is no GaN etching) to 10 μm, depending on the n-GaN layer thickness. Typically the optimum etching method or conditions will be different for the n-GaN layer 100 than for the dielectric layer 104. For example, $SF_6$ etching can be used to etch the dielectric layer 104, but will not etch the n-GaN layer 100. Therefore, etching all of the way through the dielectric layer 104 and stopping at the top surface of the semiconductor layer 100 is simple to achieve. This also has advantages for the quality of the LED structures grown in the holes 106.

The holes 106 include a first set of holes 106a, a second set of holes 106b, and may further include a third set of holes 106c. Each set of holes 106a, 106b, 106c may be arranged in a regular array, such as a rectangular array, hexagonal array or any other shape array. The diameter of the first set of holes 106a is larger than that of the second set of holes 106b, which in turn is larger than that of the third set of holes 106c. The holes 106 are also arranged in groups 107a, 107b. Each group may contain one or more holes 106. Each group 107a, 107b of holes may be located in a respective area of the dielectric layer 104 as shown by the broken lines in FIG. 1b. For example, as shown in FIG. 1b, each of the groups 107a, 107b includes one hole from each of the sets 106a, 106b, 106c. The holes of different cross sectional areas may be grouped together in different ways for different applications as will be described in more detail below. Each group of holes 107a, 107b may be identical, containing the same number of holes with the same cross sectional areas, arranged in the same relative positions, or in other applications the groups may differ.

The holes 106 are of a round cross section in the embodiment shown, but other cross sections may be used, for example oval or square.

Figure 1C:
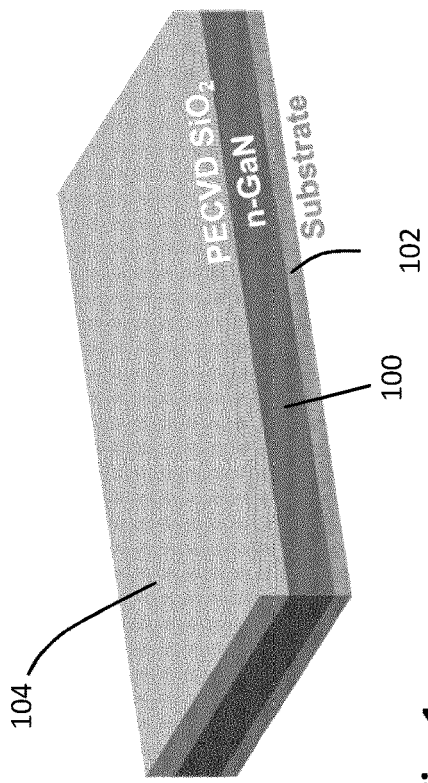
FIG. 1c shows the template of FIG. 1a with micro-LEDs grown in holes in the mask layer.

Next, referring to FIG. 1c, a standard III-nitride LED structure is grown on the exposed areas of the GaN layer 100. However, because only discrete areas of the GaN layer 100 are exposed by the micro-holes 106 in the dielectric layer or mask, the LED structures are formed as an array of discrete LEDs 108, separated by the remaining parts of the dielectric layer 104 between the micro-holes 106. The LED structures 108 are grown by either MOVPE or MBE techniques, or any other suitable growth technique. The growth occurs upwards from the exposed areas of the GaN (or other semiconductor) layer, and not from the side walls of the holes 106. Therefore, the layered LED structure can be built up inside each of the holes 106 with each of the layers being substantially flat or planar. The LED structures may comprise an n-GaN layer 110, an InGaN prelayer, an active region 112, a thin p-type AlGaN layer as a blocking layer (not shown), and then a final p-doped GaN layer 114. The active region 112 may comprise InGaN based multiple quantum wells (MQWs). An example of an LED structure is described in more detail below with reference to FIG. 2. As mentioned above, due to the dielectric mask 104, the LED structures can be grown only within the micro-holes 106, as shown in FIG. 1c, forming a μLED array. Each LED structure 108 will substantially fill the hole 106 in which it is grown. Therefore, LEDs comprise a number, three in the example shown, of sets of LEDs of different cross sectional areas and hence different emission characteristics. Here the cross sectional area refers to the area in a plane perpendicular to the general direction of growth of the LED structure. This will typically be substantially constant over the height of the LED structure 108. For example, there may be a first set of LED structures 108a having the largest cross sectional area, a second set of LED structures 108b having a smaller cross sectional area than the first set, and a third set of LED structures 108c having a still smaller cross sectional area.

Each set of LEDs is arranged in a regular array in the dielectric layer 104. For example, each set of LEDs may be arranged in a rectangular array or any other shape array. The rectangular or any other shape arrays may each have the same spacing, but may be offset from each other, as shown in FIG. 1c, so that each LED from one set forms a group with one LED from each of the other sets. In other arrangements where different groupings of the LEDs is required, the different sets of LEDs may each be arranged in a different type of array. Each group of LEDs may be identical, containing the same number of LEDs with the same cross sectional areas, arranged in the same relative positions, or in other applications the groups may differ.

It is important that the uppermost layer of the InGaN MQWs 112 should not extend above the upper surface of the dielectric layer 104. Otherwise, this could result in a short-circuit effect after the template is fabricated into a final μLED array. It is also important that the overgrown n-GaN 110 within each of the micro-hole areas directly contact the n-GaN layer 100 within the un-etched parts of the template below the dielectric mask 104 so that all the individual μLEDs are electrically connected to each other through the n-GaN layer 100 of the un-etched parts below the dielectric mask 104.

Figure 1D:
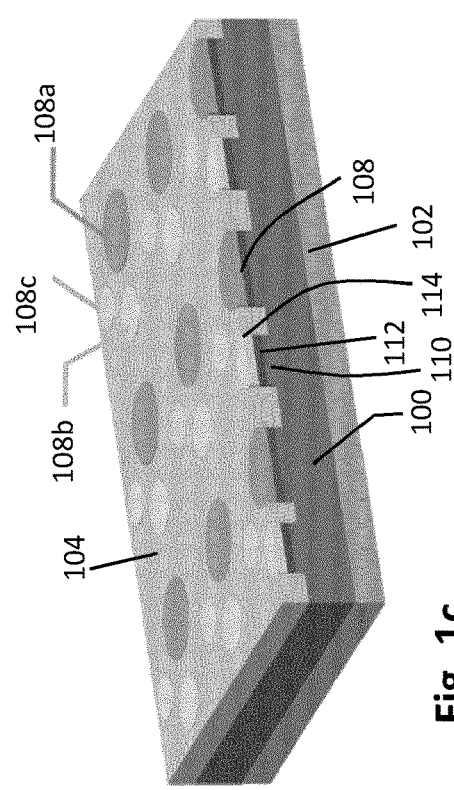
FIG. 1d shows the template of FIG. 1c with electrical contacts formed on it.

Referring to FIG. 1d, once the LED array structure is completed, further device fabrication is carried out, including the formation of electrical contacts for the array. For example, an upper contact layer 116 may be formed over the dielectric mask layer 104 and over the upper p-GaN layer of the individual micro-LED devices 108. The upper contact layer 116 therefore forms a common p-contact for all of the LED devices 108. The upper contact layer 116 may be formed of ITO or Ni/Au alloys. An anode 118 may then be formed on the p-contact layer 116. For example, a part of the dielectric layer 104 may be etched away and then the part of the LED structure on the etched dielectric layer section may be also etched down to the n-GaN, exposing an area 120 of the n-GaN 100, and a cathode 122 formed on that exposed area 120 of n-GaN.

The micro-LED structures produced in this way exhibit a number of unique features which current micro-LEDs cannot have. Under identical growth conditions, micro-LEDs with different diameters can exhibit different emission wavelengths. This is due to a combination of a number of mechanisms. First, the growth rate of InGaN/GaN multiple quantum wells (MQWs) as an emitting region in a micro-LED grown in a micro-hole depends on micro-hole diameter. Different thickness of InGaN MQWs show different emission wavelength. Second, the indium incorporation rate of InGaN/GaN MQWs also depends on micro-hole diameter. Different indium content leads to difference in the emission wavelength of InGaN/GaN MQWs. Third, the strain relaxation of InGaN/GaN MQWs along the lateral direction depends on microhole diameter, also resulting in difference in the emission wavelength of InGaN/GaN MQWs. Therefore, for example, under an optimised growth conditions, three sets of micro-LEDs with three different diameters in each group can emit red, blue and green emission. If there are two micro-LEDs with different diameters in each group, they can emit blue and yellow. If there are four micro-LEDs with different diameters in each group they can emit red, blue, green and yellow. In each of these the cases, white light can be produced from each group of LEDs. The colour rendering index and colour temperature can be tuned by add extra micro-LEDs. For example, in order to increase colour temperature, two micro-holes with identical diameter for long emission, such as green or yellow or red, can be included along with two other micro-holes with different diameters in each group. In order to decrease colour temperature, two micro-holes with identical diameter for short emission wavelength, such as blue, can be included along with two other micro-holes with different diameters in each group.

As an example, as discussed below with reference to FIGS. 5a to 5c, experiments have shown that in an array of μLEDs each with a diameter of 10 μm blue light is emitted, in an array of μLEDs each with a diameter of 20 μm green light is emitted, in an array of μLEDs each with a diameter of 30 μm red light is emitted. These micro-LEDs were obtained by growth in micro-holes with corresponding different diameters under identical conditions in a same growth run.

The wavelengths of light, and hence the cross sectional areas of the different sets of LEDs can be selected depending on the requirements of any particular application. While typically there will be quite a large difference between the wavelengths, and hence cross sectional areas, of the different sets of LEDs, the photolithographic process of forming the holes 106 is very accurate and so for LEDs on the micron scale, differences of cross sectional area down to, for example, 2% or even 1% can be produced in a controlled manner.

It will be appreciated that various modifications to the embodiments described above can be made. For example, in one modification the structure is inverted, with a p-GaN layer being grown on the substrate and covered by the dielectric layer, and then the p-GaN layer of the LED devices 108 being formed first, followed by the multiple quantum well layers, and then the n-GaN layer. An n-contact layer is then formed over the top of the dielectric layer in place of the p-contact layer, and the positions of the anode and cathode are reversed.

In the configuration of FIGS. 1a to 1d, the overgrown n-GaN 110 within the micro-holes 106 has to match the n-GaN of the un-etched parts of the n-GaN layer 100 below the dielectric mask 104 so that all the individual μLEDs 108 are electrically connected to each other through the n-GaN layer 100. Instead of using the n-GaN 100 of the un-etched n-GaN parts below the dielectric mask 104 as an electrically connected channel, in a further embodiment, a Group III nitride heterostructure with a two dimensional electron gas (2DEG) at the heterojunction is used as the semiconductor layer, instead of the n-GaN layer. In this embodiment a standard AlGaN/GaN HEMT structure is used. The electron gas (2DEG) with a high sheet carried density and high electron mobility formed at the interface between the AlGaN barrier and the GaN buffer of a high electron mobility transistor (HEMT) structure is used as an electrically connected channel.

In order to produce such a device, a standard AlGaN/GaN HEMT structure is initially grown on GaN a substrate or any foreign substrates such as sapphire, Si, SiC or even glass by means of any standard GaN growth approach using either MOVPE or MBE technique or any other epitaxy technique. For example, a GaN layer forming a buffer layer may be grown on the substrate and then an AlGaN layer forming a barrier layer is grown on the GaN layer. This structure is referred to herein as an "as-grown HEMT template". Subsequently, a dielectric layer such as $SiO_2$ or SiN or any other dielectric material, for example with a thickness in the range from 2 nm to 500 μm, is deposited on the as-grown HEMT template by using PECVD or any other suitable deposition technique. The resulting structure will be the same as that shown in FIG. 1a, but with the HEMT structure in place of the n-GaN layer 100. After that, by means of a photolithography technique and then etching processes (which can be dry-etching or wet-etching) the dielectric layer is etched down to the surface of the HEMT structure to form a micro-hole array in the dielectric layer, where the micro-hole diameter can be from 1 µm to 500 µm, and the pitch distance between adjacent hole centres may be in the range from 10 µm to 500 µm. Further etching the as-grown HEMT within the micro-hole areas can be performed using the remained regions of the dielectric layer as a mask. The as-grown HEMT etching depth can be from zero (meaning there is no any etching) to 10 µm, depending on the AlGaN barrier position of the as-grown HEMT template. However, generally the etching will extend downwards at least as far as the hetero-interface between the two layers of the as-grown HEMT structure, so as to provide good electrical contact between each of the LED structures and the 2DEG.

Next, a standard III-nitride LED structure is grown on the dielectric mask patterned HEMT template featured with micro-holes by either MOVPE or MBE technique, or any other epitaxy technique, for example as described above with reference to FIG. 1c, and contacts provided, for example as described above with reference to FIG. 1d. As with the embodiment of FIG. 1a to 1d, an important point is that the upper surface of the InGaN MQWs 212 should be below the upper surface of the dielectric layer 204 so as to avoid a short-circuit effect after being fabricated into final µLED arrays.

Figure 2:
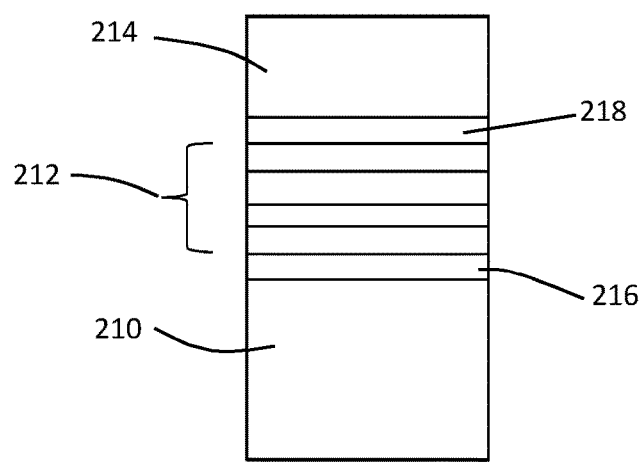
FIG. 2 is a section through an LED structure of the template of FIG. 1d.

Referring to FIG. 2, the LED structures in the LED arrays of FIGS. 1a to 1d may have any suitable structure, and typically will comprise a plurality of layers. In one example they may include the n-GaN layer 210, an InGaN prelayer 216 formed over the n-GaN layer 210, a number of InGaN quantum well layers 212 formed over the prelayer 216, a p-doped blocking layer 218, for example of p-AlGaN, and then the p-GaN layer 214. It will be appreciated that this structure can be varied in a number of ways. As indicated above, it is preferable that the top of the uppermost one of the quantum well layers 212 is below the top of the dielectric layer. It is also preferable that the top of the blocking layer 218 is also below the top of the dielectric layer.

Referring back to FIGS. 1a to 1d, in the embodiment shown in those figures, several of the small groups 107a, 107b of LEDs are treated as a large group of LEDs, including LEDs from each of the three sets of holes 106a, 106b, 106c, which is covered by a single contact layer 116. This results in a single area which can be turned on and off using the contact 118 to produce a white light source. However it will be appreciated that the different sized LEDs and their switching contacts can be arranged in various different ways depending on the application.

Figure 3:
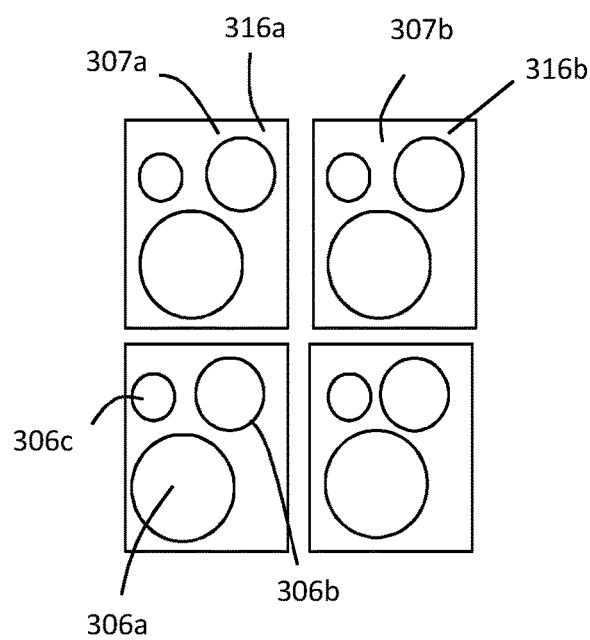
FIG. 3 is a schematic plan view of an LED array according to a further embodiment of the invention.

Referring to FIG. 3, in an arrangement in which the LED structures are laid out in a similar manner to those of FIGS. 1a to 1d, i.e. with groups of LEDs 307a, 307b each group having three LEDs 306a, 306b, 306c in it, and each of the three LEDs being of a different cross sectional area and hence a different emission spectrum and peak wavelength, each group 307a, 307b may have a respective contact layer area 316a, 316b extending over it, so that a separate contact can be provided for each group of LEDs. This allows each of the groups of LEDs to be switched on and off independently of the others. This may be useful for example in monochrome displays, for example white displays.

Figure 4:
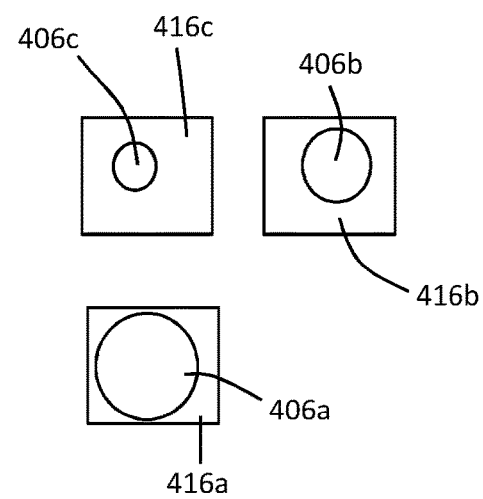
FIG. 4 is a schematic plan view of an LED array according to a further embodiment of the invention.

Referring to FIG. 4, each of the LEDs may have a separate contact layer 416a 416b, 416c extending over it so that each of the LEDs can be activated independently of the others. This arrangement may be used for example in colour displays in which each pixel can be illuminated as red, green or blue.

Figure 5A:
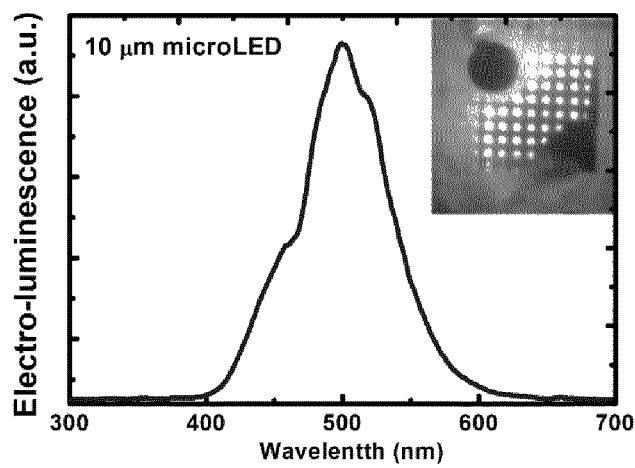
FIGS. 5a, 5b and 5c are plots of electro-photoluminescence of individual LEDs in the arrays of FIG. 1c.
Figure 5B:
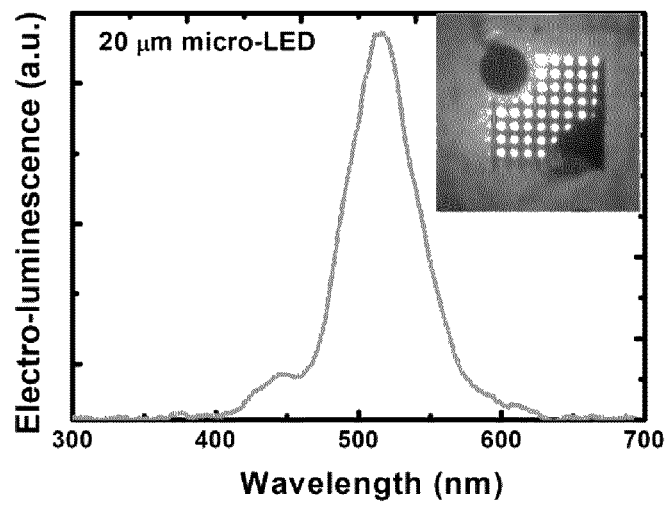
Figure 5C:
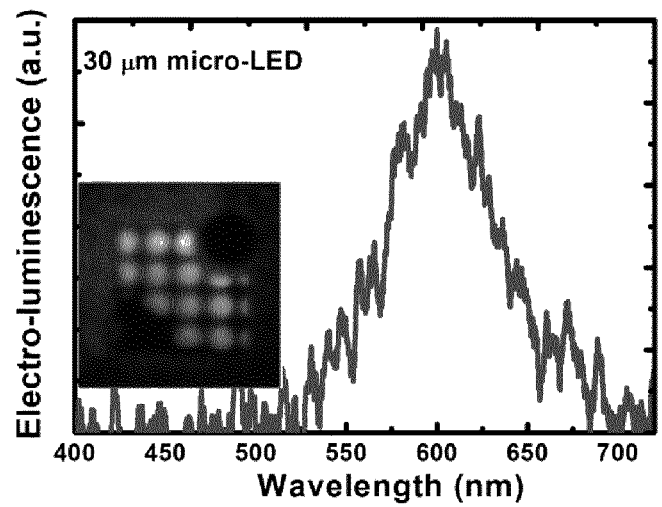

Referring to FIGS. 5a, 5b and 5c, arrays of micro-LEDs were produced as described above with reference to FIGS. 1a to 1d, but in each case all of the LEDs in each array had the same diameter, one array with 10 µm diameter LEDs, one with 20 µm diameter LEDs and one with 30 µm diameter LEDs. The electro-photoluminescence of each of the arrays of LEDs was measured and the results were as shown. As can be seen the 10 µm diameter LEDs have a peak wavelength at about 500 nm and the light they emit appears blue, the 20 µm diameter LEDs have a peak wavelength at about 520 nm and the light they emit appears green, and the 30 µm diameter LEDs have a peak wavelength at about 610 nm and the light they emit appears red. It will be appreciated that the diameters of the different LEDs in a multi-colour array such as that of FIG. 1c can be adjusted so as to achieve different combinations of colours.

The invention claimed is:

1. An LED array comprising a semiconductor layer, a dielectric layer extending over the semiconductor layer, an array of LED structures extending through holes in the dielectric layer, and a plurality of contacts,
wherein:
the LED structures comprise a first set of LED structures each of the LED structures having a first cross sectional area and a second set of LED structures each of the LED structures having a second cross sectional area different from the first cross sectional area;
the LED structure extending through a respective hole comprises an active region having a cross sectional area bounded by the cross sectional area of the respective hole;
the LED structures are arranged in a plurality of groups, each of the groups of LED structures including at least one of the LED structures from each of the sets of LED structures; and
each of the contacts is connected to a respective one of the groups of LED structures, whereby each of the groups of LED structures can be activated independently of other of the groups of LED structures.

2. The LED array according to claim 1 wherein the second cross sectional area is at least 1% greater than the first cross sectional area.

3. The LED array according to claim 1 wherein the dielectric layer has a plurality of holes through it, each of the LED structures is formed in a respective one of the holes, and the holes comprise a first set of holes each of the holes having a first cross sectional area and a second set of holes each of the holes having a second cross sectional area, and the hole second cross sectional area is different from the hole first cross sectional area.

4. The LED array according to claim 1 wherein each of the groups of LED structures includes only the LED structures from one of the sets of LED structures.

5. The LED array according to claim 1 wherein each of the sets of LED structures is arranged in a regular array.

6. The LED array according to claim 1 wherein the first set of LED structures has each of the LED structures arranged to emit light having a first peak wavelength and the second set of LED structures has each of the LED structures arranged to emit light having a second peak wavelength, and the second peak wavelength is different from the first peak wavelength.

7. The LED array according to claim 6 wherein the LED structures further comprise a third set of LED structures each of the LED structures having a third cross sectional area, and the third cross sectional area is different from the first and second cross sectional areas.

8. The LED array according to claim 6 wherein the LED structures further comprise a third set of LED structures each of the LED structures having a third cross sectional area, and the third cross sectional area is different from the first and second cross sectional areas, and the third set of LED structures has each of the LED structures arranged to emit light having a third peak wavelength, and the third peak wavelength is different from the first peak wavelength and the second peak wavelength.

9. A method of producing the LED array of claim 1, the method comprising:
   forming the semiconductor layer of group III nitride material;
   forming the dielectric layer;
   forming the holes through the dielectric layer;
   growing the array of LED structures in the holes; and
   forming the plurality of contacts.

10. The method according to claim 9 wherein the first cross sectional area is at least 1% greater than the second cross sectional area.

11. The method according to claim 9 wherein each of the LED structures fills the hole in which it is grown whereby the LED structures comprise a first set of LED structures each of the LED structures having a first cross sectional area and a second set of LED structures each of the LED structures having a second cross sectional area, and the LED structure second cross sectional area is different from the LED structure first cross sectional area.

12. The method according to claim 9 wherein each of the sets of holes is arranged in a regular array.

13. The method according to claim 9 wherein each of the LED structures fills the hole in which it is grown whereby the LED structures comprise a first set of LED structures each of the LED structures having a first cross sectional area and a second set of LED structures each of the LED structures having a second cross sectional area, and the LED structure second cross sectional area is different from the LED structure first cross sectional area.

14. The method according to claim 13 wherein the LED structures of the first set of LED structures are each arranged to emit light having a first peak wavelength and the LED structures of the second set of LED structures are each arranged to emit light having a second peak wavelength, and the second peak wavelength is different from the first peak wavelength.

15. The method according to claim 14 wherein the array of holes further comprises a third set of holes each of the holes of the third set of holes having a third cross sectional area different from the first and second cross sectional areas of the holes of the first and second sets of holes.

16. The method according to claim 15 wherein the array of LED structures includes a third set of LED structures grown in the third set of holes, and the LED structures of the third set of LED structures are each arranged to emit light having a third peak wavelength, and the third peak wavelength is different from the first peak wavelength and the second peak wavelength.

17. A display comprising:
   an LED array comprising a semiconductor layer, a dielectric layer extending over the semiconductor layer, an array of LED structures extending through holes in the dielectric layer, and a plurality of contacts,
   wherein:
   the LED structures comprise a first set of LED structures each of the LED structures having a first cross sectional area and a second set of LED structures each of the LED structures having a second cross sectional area different from the first cross sectional area;
   the LED structure extending through a respective hole comprises an active region having a cross sectional area bounded by the cross sectional area of the respective hole;
   the LED structures are arranged in a plurality of groups, each of the groups of LED structures including at least one of the LED structures from each of the sets of LED structures; and
   each of the contacts is connected to a respective one of the groups of LED structures, whereby each of the groups of LED structures can be activated independently of other of the groups of LED structures.

18. The display according to claim 17 wherein the second cross sectional area is at least 1% greater than the first cross sectional area.

19. The display according to claim 17 wherein the dielectric layer has a plurality of holes through it, each of the LED structures is formed in a respective one of the holes, and the holes comprise a first set of holes each of the holes having a first cross sectional area and a second set of holes each of the holes having a second cross sectional area, and the hole second cross sectional area is different from the hole first cross sectional area.

20. The display according to claim 17 wherein the first set of LED structures has each of the LED structures arranged to emit light having a first peak wavelength and the second set of LED structures has each of the LED structures arranged to emit light having a second peak wavelength, and the second peak wavelength is different from the first peak wavelength.

* * * * *